(12) United States Patent
Anderson et al.

(10) Patent No.: US 7,439,109 B2
(45) Date of Patent: Oct. 21, 2008

(54) METHOD OF FORMING AN INTEGRATED CIRCUIT STRUCTURE ON A HYBRID CRYSTAL ORIENTED SUBSTRATE

(75) Inventors: Brent A. Anderson, Jericho, VT (US); MeiKei leong, Wappingers Falls, NY (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 489 days.

(21) Appl. No.: 11/270,708

(22) Filed: Nov. 9, 2005

(65) Prior Publication Data

US 2006/0076623 A1    Apr. 13, 2006

Related U.S. Application Data

(62) Division of application No. 10/708,907, filed on Mar. 31, 2004, now Pat. No. 6,998,684.

(51) Int. Cl.
*H01L 27/12* (2006.01)
*H01L 29/788* (2006.01)

(52) U.S. Cl. ............... 438/150; 438/198; 438/982; 257/315; 257/347; 257/351

(58) Field of Classification Search ............. 257/315, 257/347, 351; 438/150, 198, 982
See application file for complete search history.

(56) References Cited

U.S. PATENT DOCUMENTS

| 6,657,223 B1 | 12/2003 | Wang et al. |
| 2004/0195623 A1 | 10/2004 | Ge et al. |
| 2004/0195646 A1 | 10/2004 | Yeo et al. |

*Primary Examiner*—Matthew S. Smith
*Assistant Examiner*—Walter H Swanson
(74) *Attorney, Agent, or Firm*—Gibb & Rahman, LLC; Richard M. Kotulak, Esq.

(57) ABSTRACT

Disclosed is an integrated circuit structure that has a substrate having at least two types of crystalline orientations. First-type transistors (e.g., NFETs) are formed on first portions of the substrate having a first type of crystalline orientation, and second-type transistors (e.g., PFETs) are formed on second portions of the substrate having a second type of crystalline orientation. Some of the first portions of the substrate comprise non-floating substrate portions, and the remaining ones of the first portions and all of the second portions of the substrate comprise floating substrate portions.

20 Claims, 17 Drawing Sheets

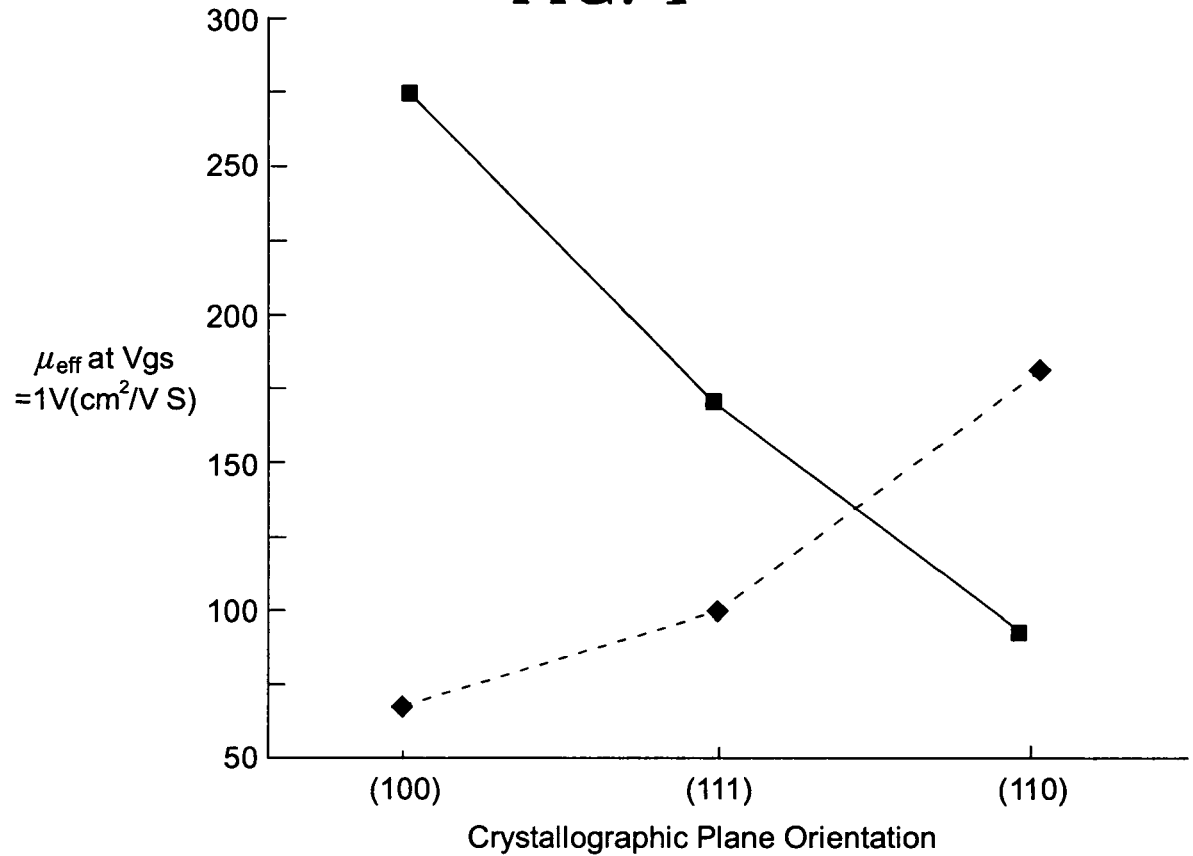
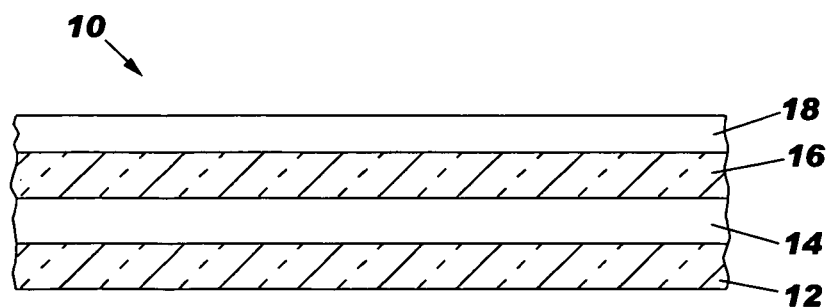

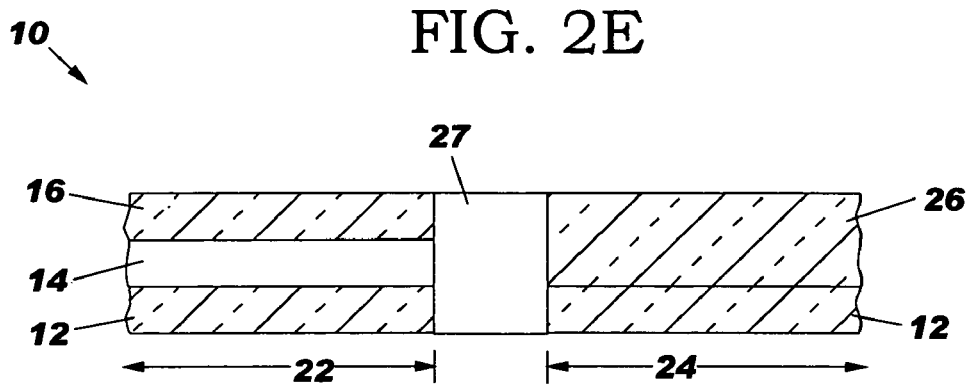
FIG. 2E
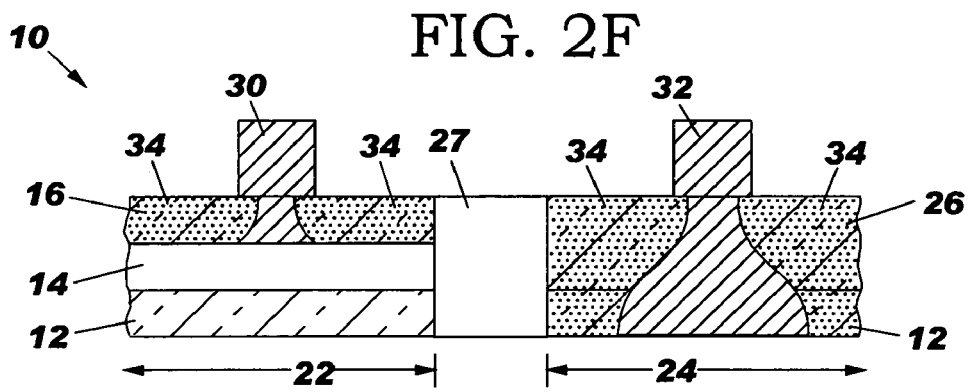
FIG. 2F
FIG. 3A
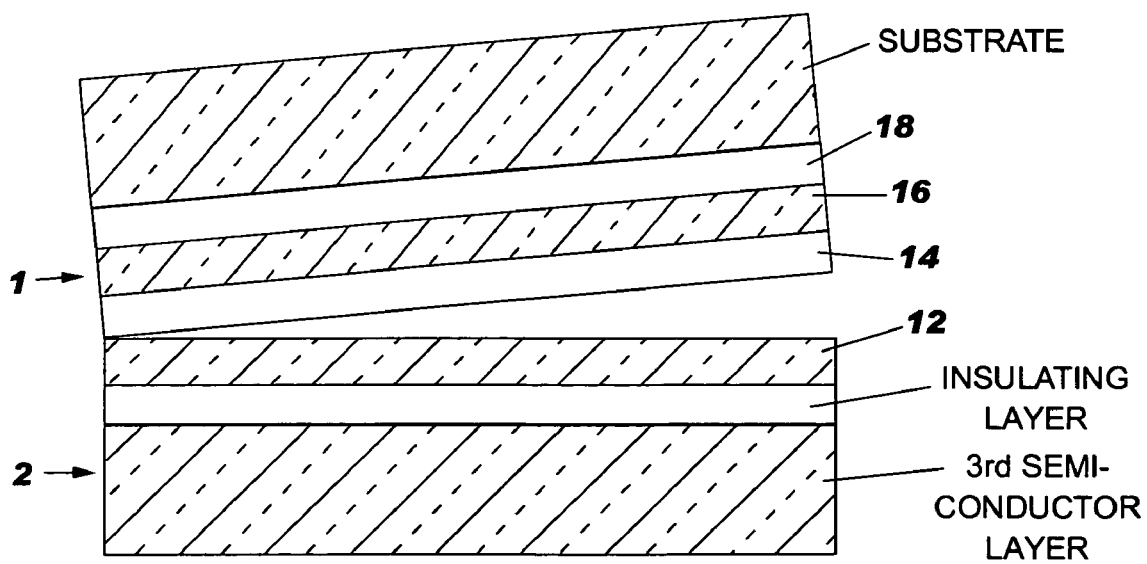

METHOD OF FORMING AN INTEGRATED CIRCUIT STRUCTURE ON A HYBRID CRYSTAL ORIENTED SUBSTRATE

CROSS REFERENCE TO RELATE APPLICATION

The present application is a division of U.S. patent application Ser. No. 10/708,907 filed Mar. 31, 2004 which has issued as U.S. Pat. No. 6,998,684 on Feb. 14, 2006, to Anderson et al., entitled "High Mobility Plane CMOS SOI", assigned to the present assignee, and incorporated herein by reference.

U.S. patent application Ser. No. 10/708,586, filed on Mar. 12, 2004 to Edward Nowak et al., entitled "High-Performance CMOS SOI Devices on Hybrid Crystal-Oriented Substrates", is also assigned to the present assignee, and incorporated herein by reference.

BACKGROUND OF THE INVENTION

1. Field of the Invention

The present invention relates to semiconductor devices, and more particularly to integrated semiconductor devices, such as silicon-on-insulator (SOI)/complementary metal oxide semiconductor (CMOS) devices, that are formed on a hybrid crystal oriented substrate. In particular, the present invention provides a means for integrating at least two types of semiconductor devices, such as NFETs and PFETs, onto a bonded substrate having different crystallographic orientations. The location of each device on the bonded substrate is dependent upon the performance of that device has on a particular crystal orientation. For example, the present invention forms NFETs on a (100) surface, while the PFETs are formed on a (110) surface. The (100) crystal surface provides NFETs with high performance, while the (110) crystal surface provides PFETs with high performance.

2. Background of the Invention

In present semiconductor technology, CMOS devices, such as NFETs or PFETs, are typically fabricated upon semiconductor wafers, such as Si, that have a single crystal orientation. In particular, most of today's semiconductor devices are built upon Si having a (100) crystal orientation.

Electrons are known to have a high mobility for a (100) Si surface orientation, but holes are known to have high mobility for a (110) surface orientation. That is, hole mobility values on (100) Si are roughly 2×-4× lower than the corresponding electron hole mobility for this crystallographic orientation. To compensate for this discrepancy, PFETs are typically designed with larger widths in order to balance pull-up currents against the NFET pull-down currents and achieve uniform circuit switching. NFETs having larger widths are undesirable since they take up a significant amount of chip area.

On the other hand, hole mobilities on (110) Si are 2× higher than on (100) Si; therefore, PFETs formed on a (110) surface will exhibit significantly higher drive currents than PFETs formed on a (100) surface. Unfortunately, electron mobilities on (110) Si surfaces are significantly degraded compared to (100) Si surfaces. The electron mobility degradation on a (110) Si surface is shown, for example, in FIG. 1. In FIG. 1, the solid line represents electron mobility, while the dashed line represents hole mobility.

As can be deduced from the above discussion and FIG. 1, the (110) Si surface is optimal for PFET devices because of excellent hole mobility, yet such a crystal orientation is completely inappropriate for NFET devices. Instead, the (100) Si surface is optimal for NFET devices since that crystal orientation favors electron mobility.

In view of the above, there is a need for providing integrated semiconductor devices that are formed upon a substrate having different crystal orientations that provide optimal performance for a specific device. That is, there is an overwhelming need to create a substrate which allows one type of device, such as, for example, a PFET, to be formed on a certain crystallographic surface, e.g., a (110) surface, while forming another type of device, such as, for example, an NFET, on another crystallographic surface, e.g., a (100) surface.

SUMMARY OF THE INVENTION

The invention provides a method of forming an integrated circuit structure, that begins with forming an insulator on a first substrate structure and bonding a second substrate structure to the insulator to form a laminated structure having a first substrate with a first crystalline orientation below the insulator, and a second substrate with a second crystalline orientation above the insulator. Next, the invention forms first openings in the laminated structure down to the insulator and forms second openings in the insulator through the first openings. The second openings are smaller than the first openings. The invention grows additional material on the first substrate through the second openings to fill the first openings to produce a substrate at the top of the laminated structure that has first portions having the first type of crystalline orientation and second portions having the second type of crystalline orientation. Next, the invention forms first-type transistors (e.g., NFETs) above the first portions of the substrate and forms second-type transistors (PFETs) above the second portions of the substrate. Some of the first portions of the substrate that are formed above the second openings in the insulator comprise non-floating substrate portions, and the remaining ones of the first portions and all of the second portions of the substrate comprise floating substrate portions.

The additional material that is grown through the first and second openings has the same crystalline orientation as the first substrate. Before forming the first openings, the invention forms a protective cap over the second substrate. The first openings are formed through the protective cap and through the second substrate. After forming the first openings, the invention forms an isolation material along sidewalls of the second substrate exposed by the first openings. After growing the additional material, the invention forms shallow trench isolation (STI) structures in the first portions and the second portions, to subdivide the first portions and the second portions. The second openings are smaller then the distance between the shallow trench isolation structures such that each of the second openings is between two adjacent shallow trench isolation structures.

This methodology produces an integrated circuit structure that has a substrate having at least two types of crystalline orientations. First-type transistors (e.g., NFETs) are formed on first portions of the substrate having a first type of crystalline orientation, and second-type transistors (e.g., PFETs) are formed on second portions of the substrate having a second type of crystalline orientation. Some of the first portions of the substrate comprise non-floating substrate portions, and the remaining ones of the first portions and all of the second portions of the substrate comprise floating substrate portions.

The floating structures comprise silicon over insulator (SOI) structures and the non-floating structures comprise biased or bulk substrate structures. The non-floating substrate portions are electrically biased by layers below the substrate. An insulator is below the floating substrate portions to electrically isolate these regions from layers below the substrate.

Because of the smaller second opening, there is actually an incomplete insulator below the non-floating substrate portions. There are shallow trench isolation (STI) regions between the non-floating substrate portions and the floating substrate portions. Each of the second portions of said substrate includes a plurality of floating substrate portions.

One unique aspect of the invention is that, because of the smaller second openings, there is actually an incomplete insulator below the non-floating substrate portions. Another unique aspect of this embodiment is that some of the first portions of the substrate comprise non-floating substrate portions, and the remaining ones of the first portions (and all of the second portions) of the substrate comprise floating substrate portions. Therefore, the invention allows the designer to select which transistors will be SOI transistors and which will be bulk transistors within one type of crystal orientation substrate group.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF THE DRAWINGS

The invention will be better understood from the following detailed description with reference to the drawings, in which:

FIG. 1. is a plot of μeff at Vgs=1V vs. crystallographic orientation for a Si substrate;

FIGS. 2A-2F are pictorial representations (through cross sectional views) illustrating the basic processing steps utilized in the present invention in forming integrated CMOS devices on different crystallographic orientation planes of a bonded substrate;

FIGS. 3A-3D are pictorial representations of various wafers that may be bonded together and used in the method described in FIGS. 2A-2E;

DETAILED DESCRIPTION OF PREFERRED EMBODIMENTS OF THE INVENTION

Figure 2B:
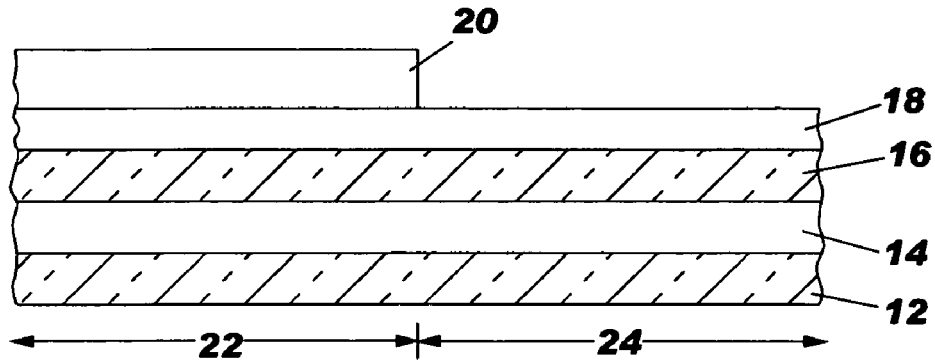

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The following provides a method of forming different semiconductor devices, such as NFETs and PFETs, onto a bonded substrate having different crystallographic surfaces, will now be described in greater detail by referring to the following discussion as well as the drawings that accompany the present application. In the accompanying drawings, like and correspondence elements are referred to by like reference numerals.

FIG. 2A illustrates a bonded substrate 10, i.e., hybrid substrate, which may be employed in the present invention. As shown, bonded substrate 10 includes a surface dielectric layer 18, a first semiconductor layer 16, an insulating layer 14, and a second semiconductor layer 12. The bonded substrate 10 may further include an optional third semiconductor layer (not shown) that is located beneath the second semiconductor layer 12. In the optional bonded substrate, another insulating layer separates the second semiconductor layer 12 from the optional third semiconductor layer.

The surface dielectric layer 18 of the bonded substrate 10 is an oxide, nitride, oxynitride or other insulating layer that is either present in one of the initial wafers before bonding, or formed atop the first semiconductor layer 16 after wafer bonding by either a thermal process (i.e., oxidation, nitridation or oxynitridation) or by deposition. Notwithstanding the origin of the surface dielectric layer 18, the surface dielectric layer 18 has a thickness of from about 3 to about 500 nm, with a thickness of from about 5 to about 20 nm being more highly preferred.

The first semiconductor layer 16 is comprised of any semiconducting material including, for example, Si, SiC, SiGe, SiGeC, Ge alloys, GaAs, InAs, InP as well as other III/V or II/VI compound semiconductors. First semiconductor layer 16 may also comprise an SOI layer of a preformed SOI substrate or a layered semiconductor such as, for example, Si/SiGe. The first semiconductor layer 16 is also characterized as having a first crystallographic orientation, which is preferably (110). Although a (110) crystal orientation is preferred, the first semiconductor layer 16 may have a (111), or a (100) crystal orientation.

The thickness of the first semiconductor layer 16 may vary depending on the initial starting wafers used to form the bonded substrate 10. Typically, however, the first semiconductor layer 16 has a thickness of from about 5 to about 500 nm, with a thickness of from about 5 to about 100 nm being more highly preferred.

The insulating layer 14 which is located between the first semiconductor layer 16 and the second semiconductor layer 12 has a variable thickness depending upon the initial wafers used to create the bonded substrate 10. Typically, however, the insulating layer 14 has a thickness of from about 1 to about 5 nm, with a thickness of from about 5 to about 100 nm being more highly preferred. The insulating layer 14 is an oxide or other like insulator material that is formed on one or both of the wafers prior to bonding.

The second semiconductor layer 12 is comprised of any semiconducting material which may be the same or different from that of the first semiconductor layer 16. Thus, second semiconductor layer 12 may include, for example, Si, SiC, SiGe, SiGeC, Ge alloys, GaAs, InAs, InP as well as other III/V or II/VI compound semiconductors. Second semiconductor layer 12 may also comprise an SOI layer of a preformed SOI substrate or a layered semiconductor such as, for example, Si/SiGe. The second semiconductor layer 12 is also characterized as having a second crystallographic orientation, which is different from the first crystallographic orientation. When forming structures with FinFET transistors, rather than using materials having different crystal orientation, one substrate 60 can be rotated 45° with respect to the other substrate 64 during the bonding process, to provide a different crystal orientation, using the same material substrates. Since the first semiconductor layer 16 is preferably a (110) surface, the crystallographic orientation of the second semiconductor layer 12 is preferably (100). Although a (100) crystal orientation is preferred, the second semiconductor layer 12 may have a (111), or a (110) crystal structure.

The thickness of the second semiconductor layer 12 may vary depending on the initial starting wafers used to form the bonded substrate 10. Typically, however, the second semiconductor layer 12 has a thickness of from about 5 nm to about 200 μm, with a thickness of from about 5 to about 100 nm being more highly preferred.

When an optional third semiconductor layer is present, the optional third semiconductor layer may comprise the same or different semiconducting material as that of the second semiconductor layer 12. The crystal orientation of the optional third semiconductor layer is typically, but not always, the same as the second semiconductor layer. The optional third semiconductor layer is generally thicker than the second semiconductor layer 12. When the optional third layer is present, an insulating layer separates the optional third semiconductor layer from the second semiconductor layer.

The bonded substrate 10 illustrated in FIG. 2A is comprised of two semiconductor wafers that are bonded together. The two wafers used in fabricating the bonded substrate 10 may include two SOI wafers (See, FIG. 3A), wherein one of the wafers, designated as 1, includes the first semiconductor layer 16 and the other wafer, designated as 2 includes the second semiconductor 12; an SOI wafer (designated as 2) and a bulk semiconductor wafer (designated as 1; see, FIG. 3B); two bulk semiconductor wafers (designated as 1 and 2, respectively; see FIG. 3C) which both contain an insulating layer 14 thereon; or an SOI wafer (designated as 2) and a bulk wafer (designated as 1) which includes an ion implant region 11, such as a H2 implant region, which can be used to split a portion of at least one of the wafers during bonding (See FIG. 3D).

Bonding is achieved by first bringing the two wafers into intimate contact with each other; optionally applying an external force to the contacted wafers; and then heating the two contacted wafers under conditions that are capable of bonding the two wafers together. The heating step may be performed in the presence or absence of an external force. The heating step is typically performed in an inert ambient at a temperature of from about 200° to about 1050° C. for a time period of from about 2 to about 20 hours. More preferably, the bonding is performed at a temperature of from about 200° to about 400° C. for a time period of from about 2 to about 20 hours. The term "inert ambient" is used in the present invention to denote an atmosphere in which an inert gas, such as He, Ar, N2, Xe, Kr or a mixture thereof, is employed. A preferred ambient used during the bonding process is N2.

In the embodiment where two SOI wafers are employed, some material layers of at least one of the SOI wafers may be removed after bonding utilizing a planarization process such as chemical mechanical polishing (CMP) or grinding and etching. The planarization process stops when surface dielectric layer 18 is reached.

In the embodiment in which one of the wafers includes an ion implant region, the ion implant region forms a porous region during bonding which causes a portion of the wafer above the ion implant region to break off leaving a bonded wafer such as is shown, for example, in FIG. 3A. The implant region is typically comprised of H2 ions which are implanted into the surface of the wafer utilizing ion implantation conditions that are well known to those skilled in the art.

In the embodiment where the wafers to be bonded do not include a dielectric layer therein, the surface dielectric layer 18 may be formed atop the bonded wafers by a thermal process, such as oxidation, or by a conventional deposition process such as chemical vapor deposition (CVD), plasma-enhanced CVD, atomic layer deposition, chemical solution deposition as well as other like deposition processes.

Figure 3B:
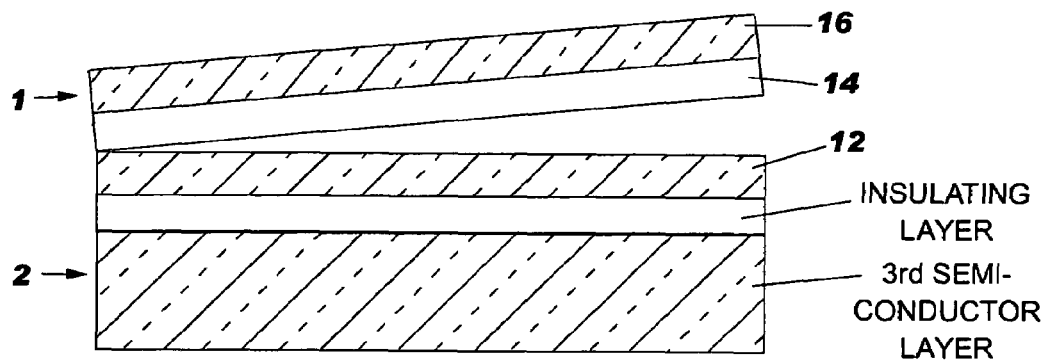
Figure 3C:
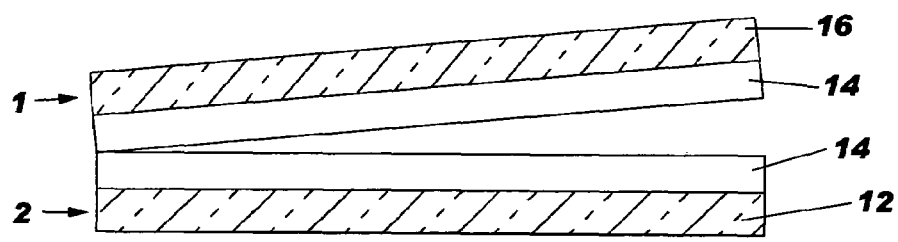
Figure 3D:
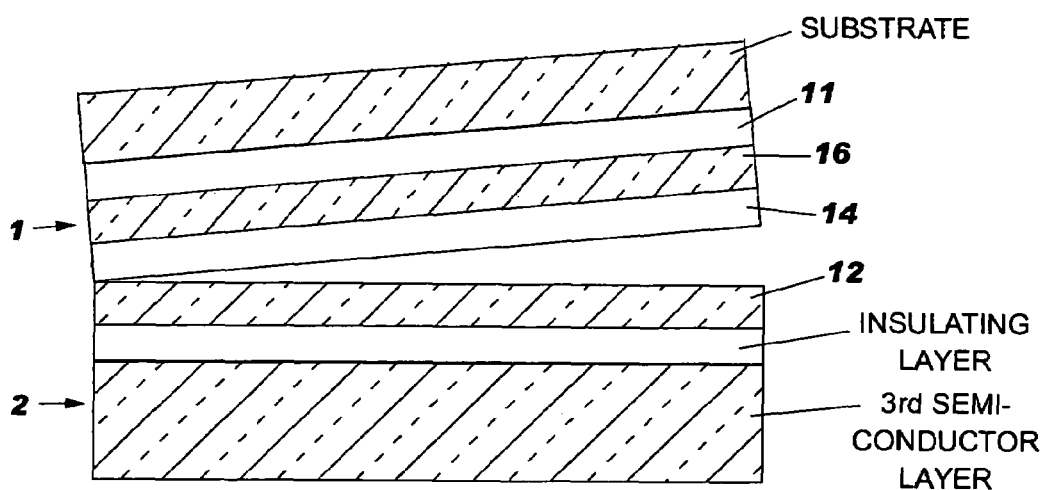

As shown in FIG. 2B, mask 20 is then formed on a predetermined portion of the bonded substrate 10 of FIG. 2A so as to protect a portion of the bonded substrate 10, while leaving another portion of the bonded substrate 10 unprotected. The protected portion of the bonded substrate 10 defines a first device region 22 of the structure, whereas the unprotected portion of the bonded substrate 10 defines a second device area 24. In one embodiment, mask 20 is formed on a predetermined portion of the surface dielectric layer 18 by applying a photoresist mask to the entire surface of the bonded substrate 10. After application of the photoresist mask, the mask is patterned by lithography, which includes the steps of exposing the photoresist to a pattern of radiation and developing the pattern utilizing a resist developer. The resultant structure including the mask 20 formed on a predetermined portion of the bonded substrate 10 is shown, for example, in FIG. 2B.

In another embodiment mask 20 is a nitride or oxynitride layer that is formed and patterned utilizing lithography and etching. The nitride or oxynitride mask 20 may be removed after defining the region for the second semiconductor device.

After providing the mask 20 to the bonded substrate 10, the structure is subjected to one or more etching steps so as to expose a surface of the second semiconductor layer 12. Specifically, the one or more etching steps used at this point of the present invention removes the unprotected portions of the surface dielectric layer 18, as well as underlying portions of the first semiconductor layer 16, and a portion of the insulating layer 14 which separated the first semiconductor layer 16 from the second semiconductor layer 12. The etching may be performed utilizing a single etching process or multiple etching steps may be employed. The etching used at this point of the present invention may include a dry etching process such as reactive-ion etching, ion beam etching, plasma etching or laser etching, a wet etching process wherein a chemical etchant is employed or any combination thereof. In a preferred embodiment of the present invention, reactive-ion etching (RIE) is used in selectively removing the unprotected portions of the surface dielectric layer 18, the first semiconductor layer 16 and the insulating layer 14 in the second semiconductor device region 24. The resultant structure after the etching process has been performed is shown, for example, in FIG. 2C. Note that the sidewalls of the protected first device region 22, i.e., the surface dielectric layer 18, the first semiconductor layer 16, the insulating layer 14 and the second semiconductor layer 12, are exposed after this etching step. As shown, the exposed sidewalls of layers 18, 16 and 14 are aligned with an outer most edge of mask 20.

Figure 2C:
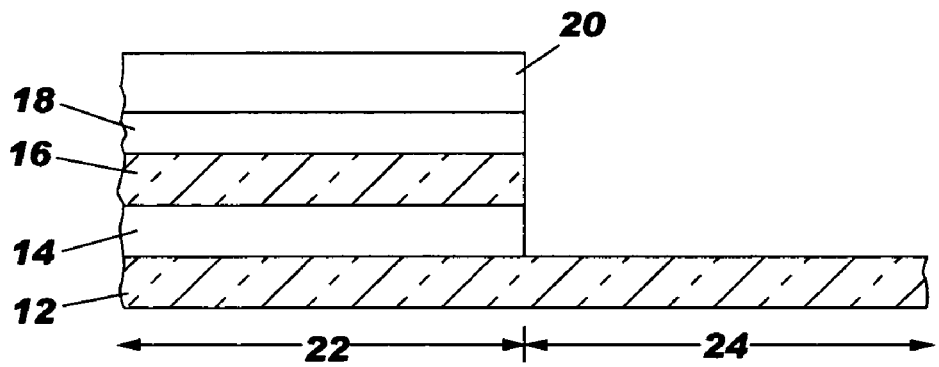
Figure 2D:
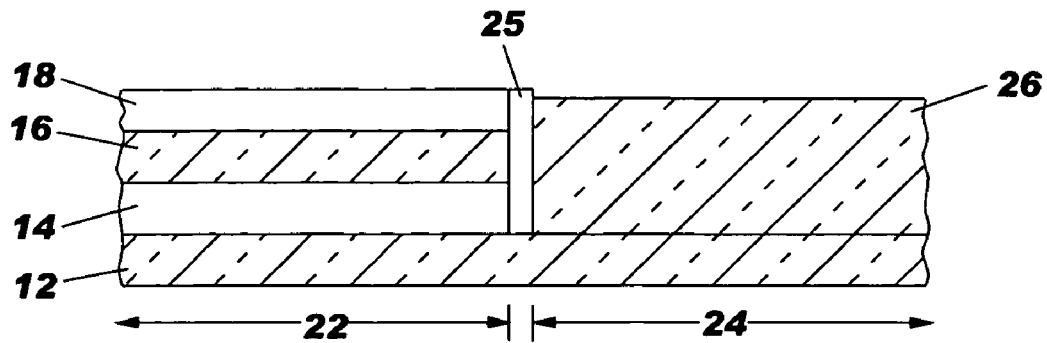

The mask 20 is then removed from the structure shown in FIG. 2C utilizing a conventional resist stripping process and then a liner or spacer 25 is formed on the exposed sidewalls. As shown in FIG. 2D, the liner or spacer 25 is formed by deposition and etching. The liner or spacer 25 is comprised of an insulating material such as, for example, an oxide.

After forming the liner or spacer 25, a semiconductor material 26 is formed on the exposed second semiconductor layer 12. In accordance with the present invention, semiconductor material 26 has a crystallographic orientation that is the same as the crystallographic orientation of the second semiconductor layer 12. The resultant structure is shown, for example, in FIG. 2D.

The semiconductor material 26 may comprise any Si-containing semiconductor, such as Si, strained Si, SiGe, SiC, SiGeC or combinations thereof, which is capable of being formed utilizing a selective epitaxial growth method. In some preferred embodiments, semiconductor material 26 is comprised of Si. In other preferred embodiments, the semiconductor material is a strained Si layer that is located atop a relaxed SiGe alloy layer. In the present invention, semiconductor material 26 may be referred to as a regrown semiconductor material.

Next, the structure shown in FIG. 2D is subjected to a planarization process such as chemical mechanical polishing (CMP) or grinding such that the upper surface of the semiconductor material 26 is substantially planar with the upper surface of the first semiconductor layer 16. Note that the previously protected portion of surface dielectric layer 18 is removed during this planarization process.

After providing the substantially planar surfaces, an isolation region 27, such as a shallow trench isolation region, is typically formed so as to isolate the first semiconductor device region 22 from the second semiconductor device region 24. The isolation region 27 is formed utilizing processing steps that are well known to those skilled in the art including, for example, trench definition and etching; optionally lining the trench with a diffusion barrier; and filling the trench with a trench dielectric such as an oxide. After the trench fill, the structure may be planarized and an optional densification process step may be performed to densify the trench dielectric.

The resultant substantially planar structure containing isolation region 27 is show, for example, in FIG. 2E. As shown, the structure of FIG. 2E includes an exposed first semiconductor layer 16 of a first crystal orientation and an unexposed regrown semiconductor material 26 that has the same crystal orientation as that of the second semiconductor layer 12.

FIG. 2F shows the integrated structure that is formed after a first semiconductor device 30 is formed on a portion of the first semiconductor layer 16 and a second semiconductor device 32 is formed on the regrown semiconductor material 26. Despite showing the presence of only one semiconductor device in each device region, the present invention contemplates forming a plurality of each type of device in the specific device region. In accordance with the present invention, the first semiconductor device may be a PFET or a NFET, whereas the second semiconductor device may be a NFET or PFET, with the proviso that the first semiconductor device is different from the second semiconductor device and that the specific device is fabricated on a crystal orientation that provides a high performance device. The PFETs and NFETs are formed utilizing standard CMOS processing steps that are well known to those skilled in the art. Each FET includes a gate dielectric, a gate conductor, an optional hard mask located atop the gate conductor, spacers located on sidewalls of at least the gate conductor, and source/drain diffusion regions. The diffusion regions are labeled as 34 in FIG. 2F. Note that the PFET is formed over the semiconductor material that has a (110), or (111) orientation, whereas the NFET is formed over a semiconductor surface having a (100), or (111) orientation.

The above description and FIGS. 2A-2F illustrate the basic concept of the present invention which includes providing a bonded substrate having two different crystallographic orientations, masking, etching, regrowth, planarization and device formation. The following description with references to FIGS. 4A-4J illustrate processing steps used in forming a high performance semiconductor device containing two NFETs formed on a (100) crystallographic surface, and a PFET, which is located between the NFETs, formed on a (110) crystallographic surface.

Figure 4A:
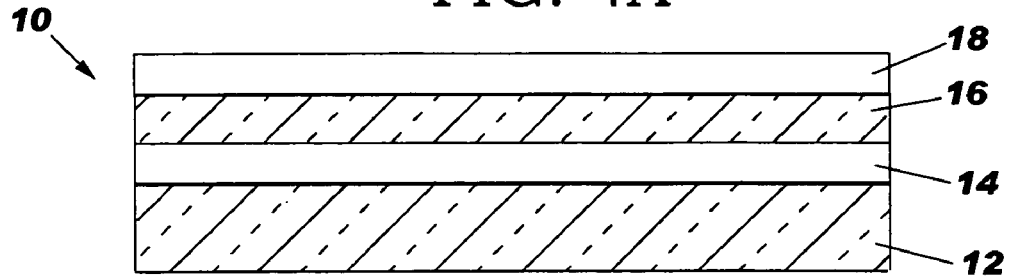
FIGS. 4A-4J are pictorial representations (through cross sectional views) illustrating the basic processing steps used in forming a high performance semiconductor device containing two NFETs formed on a (100) crystallographic surface, and a PFET, which is located between the NFETs, formed on a (110) crystallographic surface.

FIG. 4A illustrates a bonded substrate 10 that may be used in this embodiment of the present invention. The bonded substrate 10 includes a surface dielectric layer 18, a first semiconductor layer 16, an insulating layer 14 and a second semiconductor layer 12. A third optional semiconductor layer may be located beneath the second semiconductor layer 12. In such an embodiment, an insulating layer separates the second semiconductor layer from the optional third semiconductor layer.

Figure 4B:
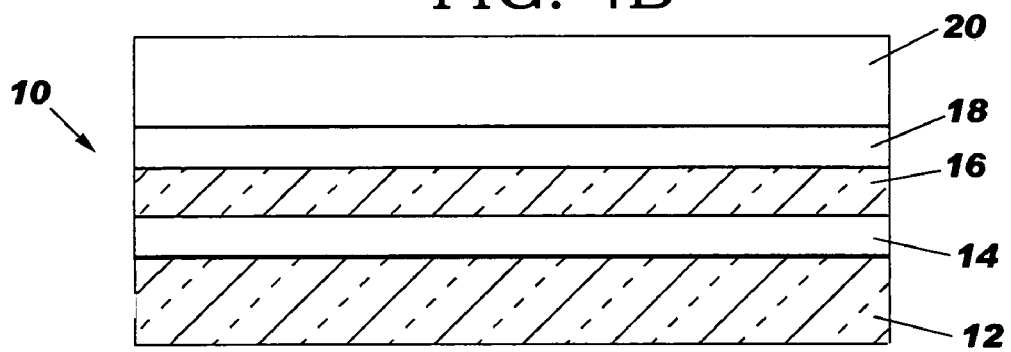

FIG. 4B illustrates the structure after nitride mask 20 has been formed on the surface dielectric layer 18. The nitride mask 20 is formed utilizing a conventional deposition process such as CVD.

Figure 4C:
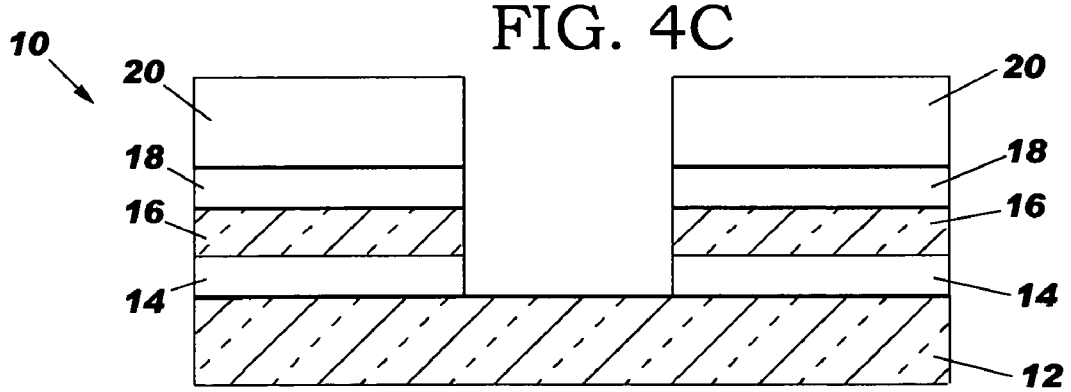

After formation of nitride mask 20, the mask is patterned utilizing a patterned photoresist mask and etching, and then the pattern is transferred via another etching process from nitride mask 20 into the structure stopping atop an upper surface layer of the second semiconductor layer 12. The etching used in the second etching removes portions of the surface dielectric layer 18, the first semiconductor layer 16, and the insulating layer 14. A single or multiple etching process is performed in transferring the pattern into the bonded substrate 10. FIG. 4C shows the resultant structure after pattern transfer.

Figure 4D:
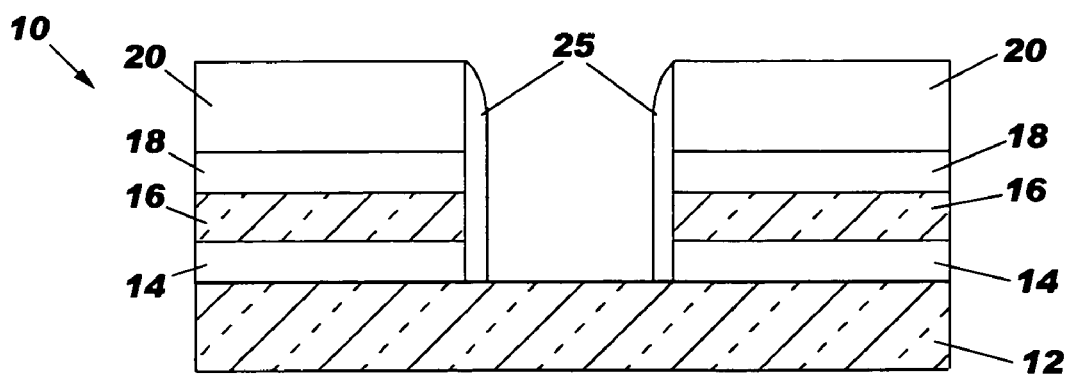

Next, and as shown in FIG. 4D, spacers 25 are formed on the exposed sidewalls. The spacers 25 are composed of an insulating material including, for example, an oxide. The spacers 25 which are located on the sidewalls of the protected first device region are formed by deposition and etching.

Figure 4E:
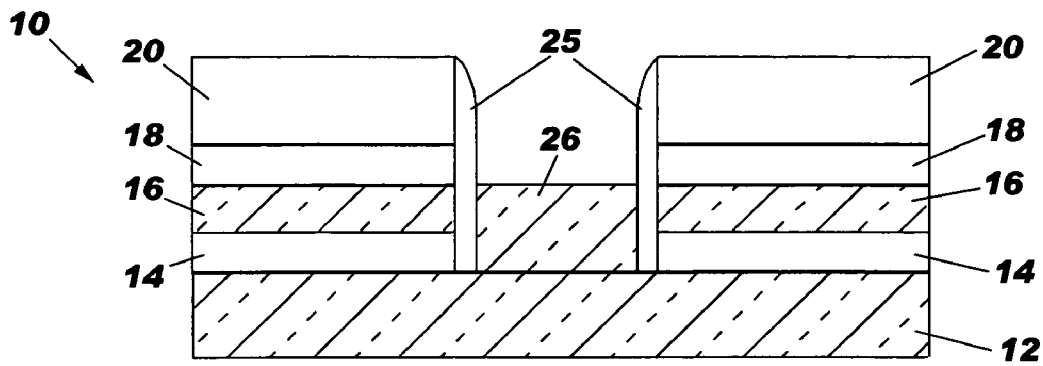

After formation of the spacers 25, semiconductor material 26 is formed on the exposed surface of the second semiconductor layer 12 providing the structure shown, for example, in FIG. 4E. The structure illustrated in FIG. 4E is then planarized to provide the substantially planer structure shown in FIG. 4F. Note that the planarization step removes the nitride mask 20 and the surface dielectric layer 18 that were not previously etched so as to provide a structure in which first semiconductor layer 16 is exposed and regrown semiconductor material 26 is exposed. The exposed first semiconductor layer 16 is the region in which a first semiconductor device such as an NFET will be formed, whereas the exposed surface of semiconductor material 26 is the region in which a second semiconductor device, such as a PFET, will be formed.

Figure 4F:
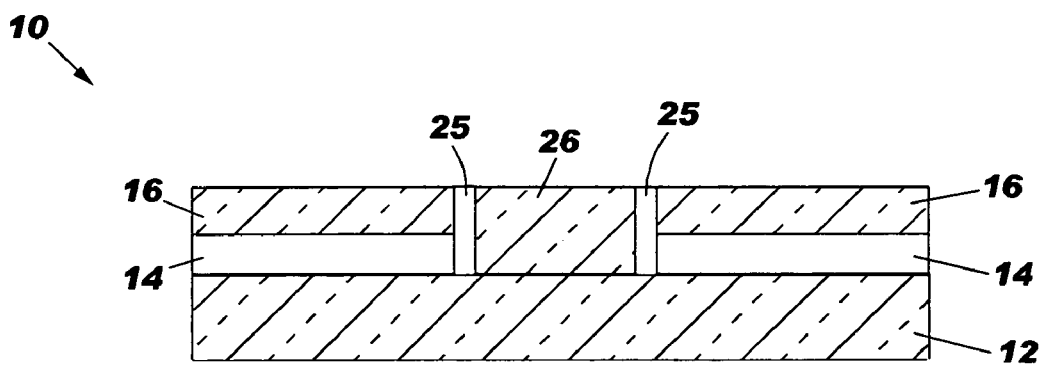
Figure 4G:
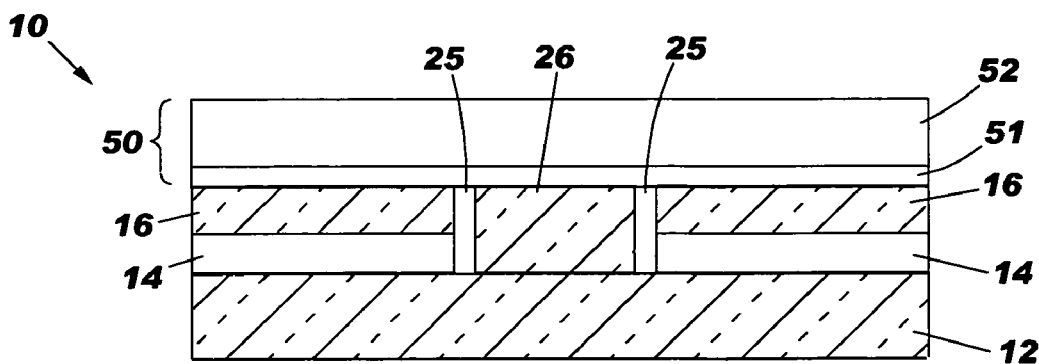

Next, and as shown in FIG. 4G, a material stack 50 comprising a pad oxide 51 and a pad nitride 52 is then formed atop the substantially planar structure shown in FIG. 4F. The pad oxide 51 of the material stack 50 is formed by either a thermal oxidation process or by deposition, while the pad nitride 52 is formed by a thermal nitridation process or deposition. The pad nitride 52 is typically thicker than the underlying pad oxide 51.

Figure 4H:
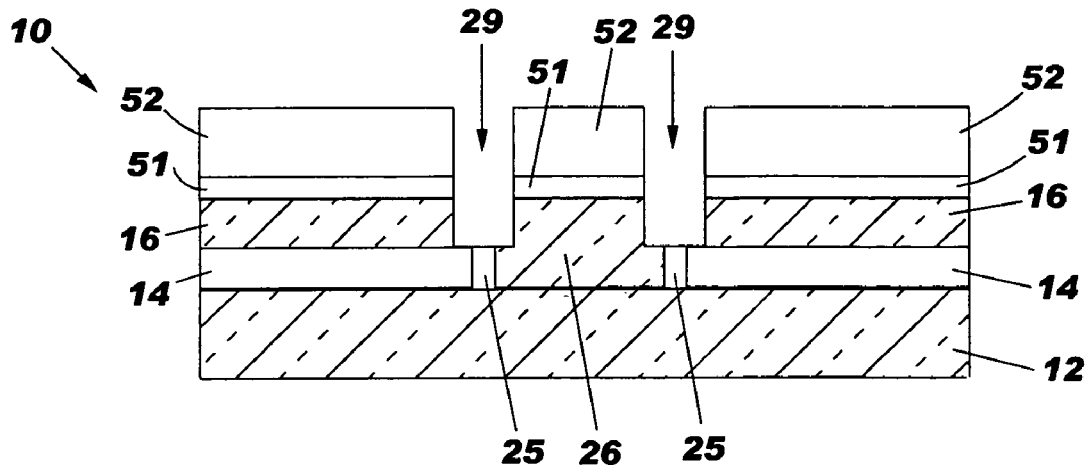

The material stack 50 is used in defining the trench openings for isolation regions 27. FIG. 4H illustrates the structure that is formed after trench openings 29 have been formed into the structure shown in FIG. 4G. The trench openings 29 are formed by lithography and etching.

Figure 4I:
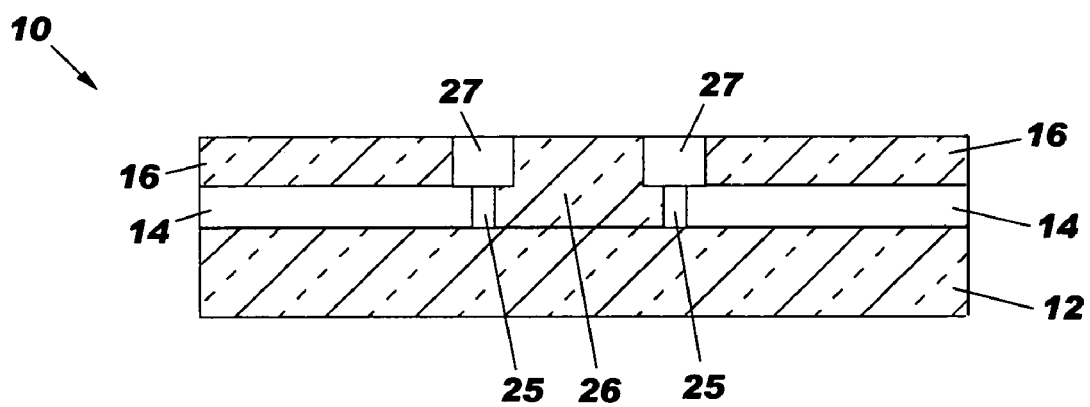

After defining the trench openings 29, the trench openings 29 are filled with a trench dielectric such as an oxide and planarized to the first semiconductor layer 16 and the regrown semiconductor material 26. FIG. 4I shows the structure that is formed after trench filling and planarization. The structure shown in FIG. 4I includes three device regions; two of which are referred to as first device regions 22 in which a first semiconductor device 30 will be formed and the third is a second device region 24 in which a second semiconductor device 32 will be formed.

Figure 4J:
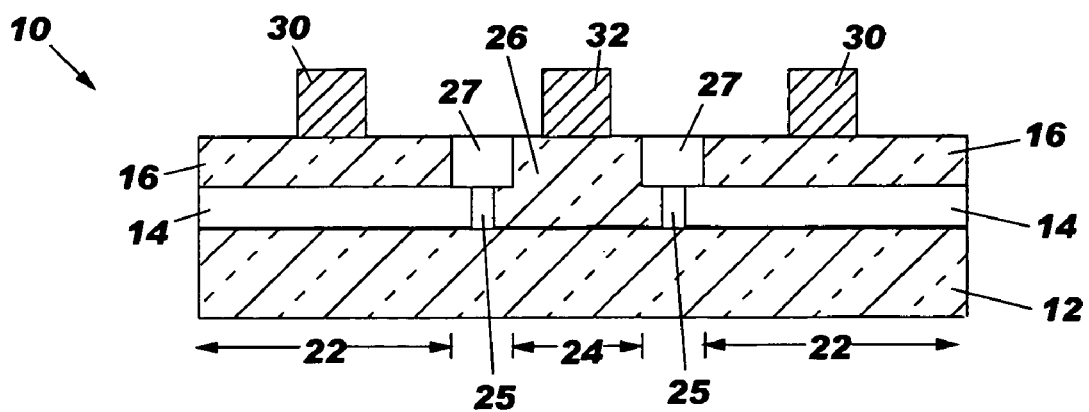

FIG. 4J shows the integrated structure that is formed after a first semiconductor device 30 is formed on a portion of the first semiconductor layer 16 and a second semiconductor device 32 is formed on the regrown semiconductor material 26. Despite showing the presence of only one semiconductor device in each device region, the present invention contemplates forming a plurality of each type of device in the specific device region. In accordance with the present invention, the first semiconductor device may be a PFET (or NFET), whereas the second semiconductor device may be a NFET (or PFET). The PFETs and NFETs are formed utilizing standard CMOS processing steps that are well known to those skilled in the art. Each FET includes a gate dielectric, a gate conductor, an optional hard mask located atop the gate conductor, spacers located on sidewalls of at least the gate conductor, source/drain diffusion regions. Note that the PFET is formed over a surface having a (110) or (111) orientation, whereas the NFET is formed over a surface having a (100) or (111) orientation. In the structure shown in FIG. 4J, the NFETs are SOI-like devices, whereas the PFET is a bulk-like semiconductor device. If a third semiconductor layer was present beneath the second semiconductor layer 12, all three devices would be SOI-like.

FIGS. 5A-5G illustrates alternative processing steps used in forming a high performance semiconductor device containing two NFETs formed on a (100) crystallographic surface, and a PFET, which is located between the NFETs, formed on a (110) crystallographic surface. The alternative method begins with forming the bonded substrate shown in FIG. 5A. The bonded substrate 10 includes at least a surface dielectric layer 18, a first semiconductor layer 16, an insulating layer 14 and a second semiconductor layer 12. A third optional semiconductor layer may be located beneath the second semiconductor layer.

Figure 5A:
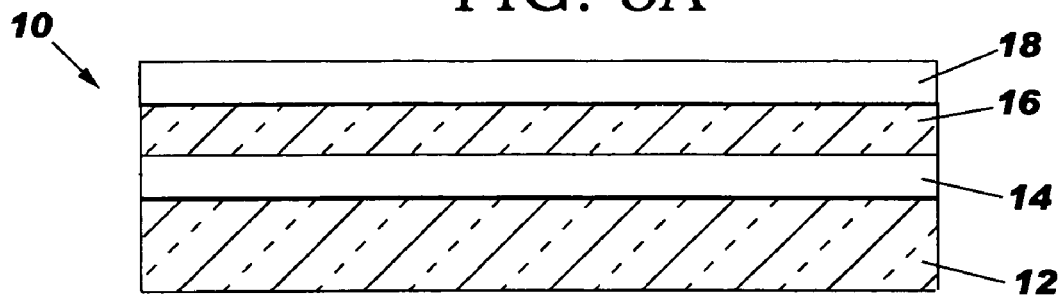
FIGS. 5A-5G are pictorial representations (through cross sectional views) illustrating alternative processing steps used in forming a high performance semiconductor device containing two NFETs formed on a (100) crystallographic surface, and a PFET, which is located between the NFETs, formed on a (110) crystallographic surface.
Figure 5B:
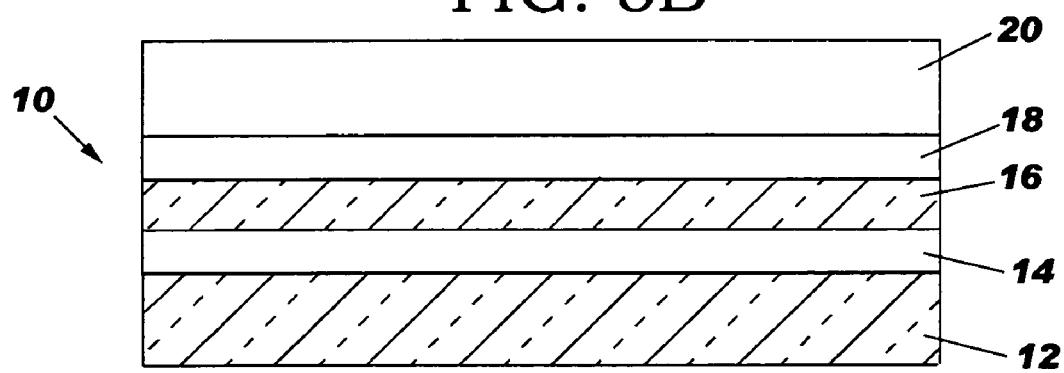
Figure 5C:
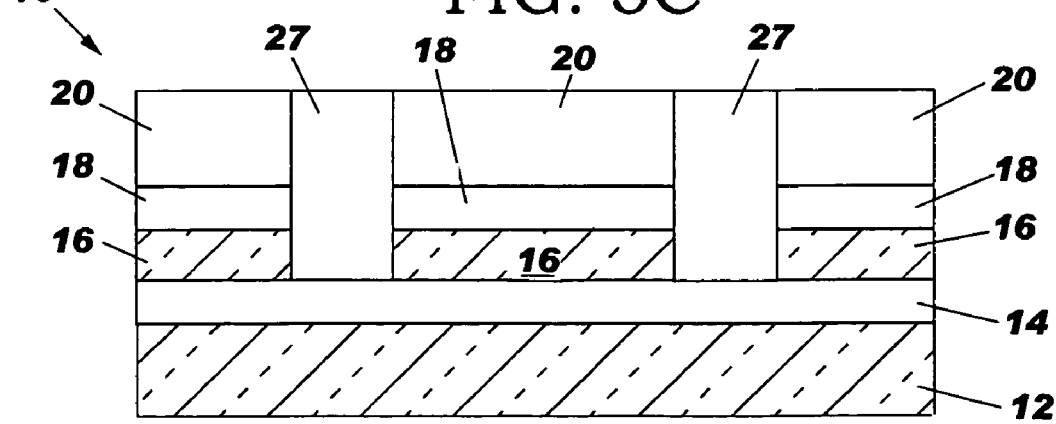

Next, nitride mask 20 is formed on the bonded substrate 10 to provide the structure illustrated in FIG. 5B. After forming the nitride mask 20 on the bonded substrate 10, isolation regions 27 are formed utilizing the nitride mask 20 and surface dielectric 18 as a combined etch mask. Isolation regions 27 are formed by applying a photoresist to the surface of the nitride mask 20, patterning the photoresist and transferring the pattern from the photoresist into the nitride mask 20 and then into the surface dielectric layer 18 to expose the first semiconductor layer 16. The exposed first semiconductor layer 16 is then etched stopping on an upper surface of the insulating layer 14. The trenches formed by the etching step are then filled with a trench dielectric and planarized to an upper surface of the nitride mask 20. FIG. 5C shows the structure after trench fill and planarization. In particular, isolation regions 27 are shown in FIG. 5C.

Figure 5D:
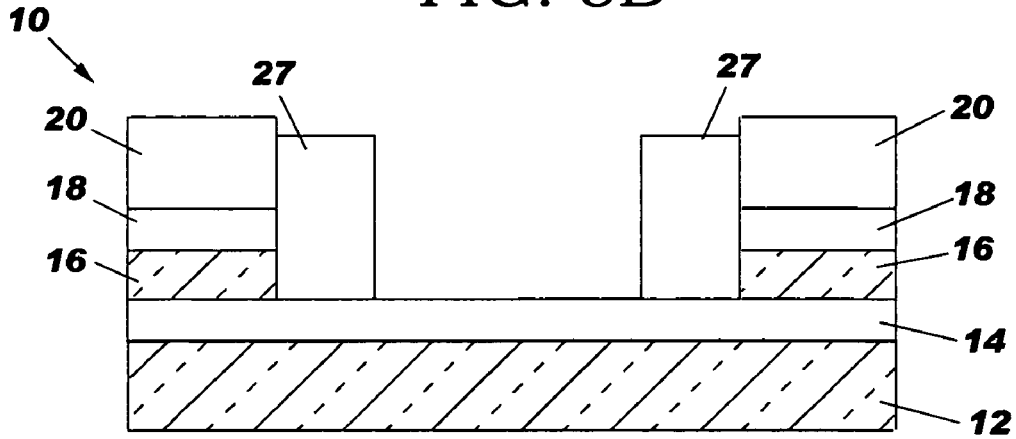

The material between the isolation regions is then removed providing the structure shown in FIG. 5D. Specifically, the material between the isolation regions is removed by forming a block mask to protect portions of the structure in which the first semiconductor devices will be formed and then etching the unprotected portions of the nitride mask 20, the surface dielectric layer 18 and the first semiconductor layer 16, stopping on the insulating layer 14.

Figure 5E:
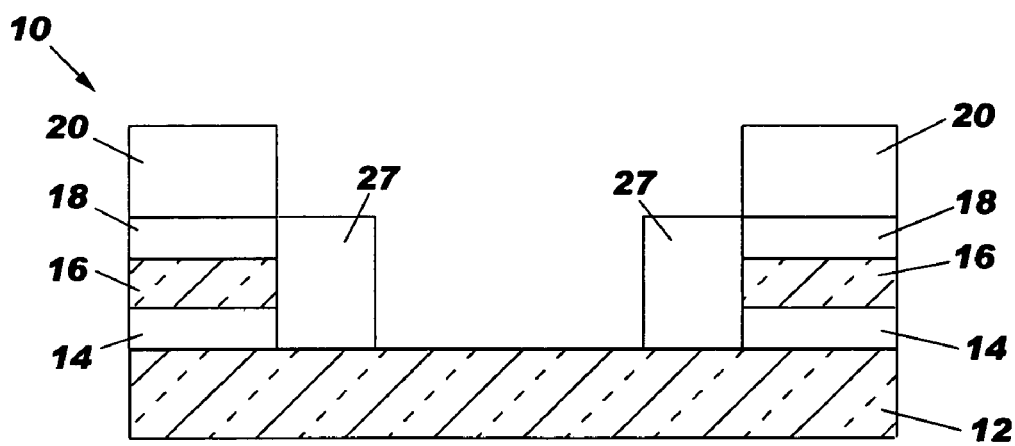

The exposed portion of the insulating layer 14 is then removed utilizing an etching process that selectively removes an insulator material, such as an oxide, providing the structure shown, for example, in FIG. 5E. Note that this etching step also reduces the height of isolation regions 27. This etching step stops atop an upper surface of the second semiconductor layer 12. The remaining nitride mask 20 is then stripped from the structure and then semiconductor material 26 is regrown on the exposed surface of the second semiconductor material 12 providing the structure shown, for example, in FIG. 5F. In this particular embodiment, the regrown semiconductor material 26 includes an upper layer of strained Si 31.

Figure 5F:
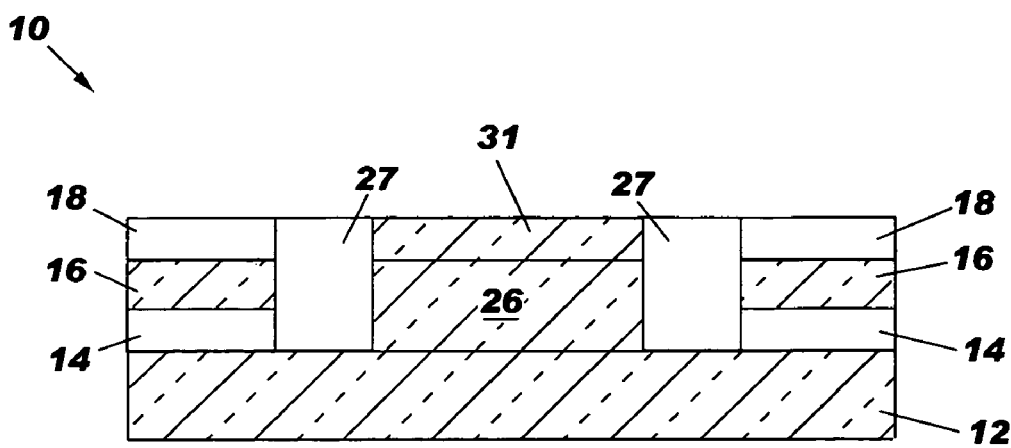
Figure 5G:
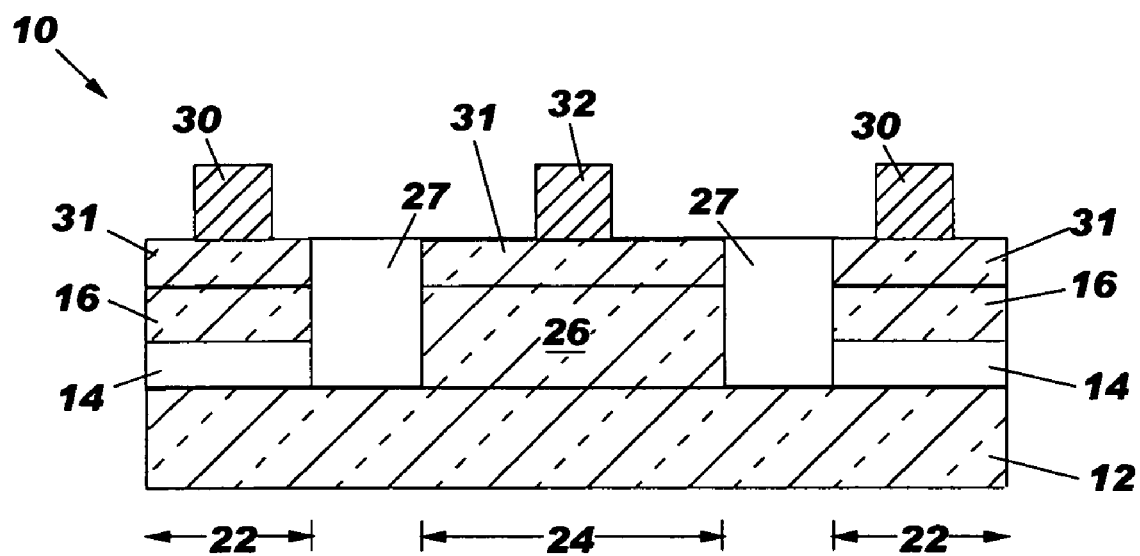

Oxide is then stripped from the structure shown in FIG. 5F and strained Si 31 is formed on the exposed portions of the first semiconductor layer 16. After forming the strained Si layers, CMOS devices 30 and 32 are formed over the respective crystal orientation that provides a high performance device. The resultant structure containing NFETs and PFETs formed atop strained Si layers is shown, for example, in FIG. 5G.

Figure 6A:
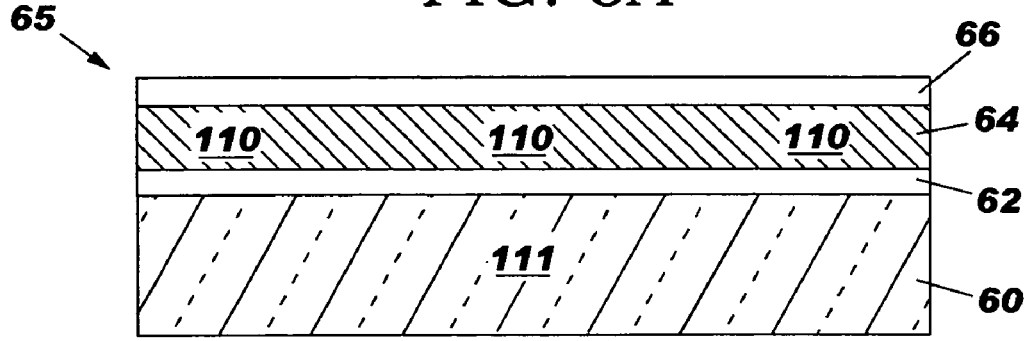
FIGS. 6A-6E are pictorial representations (through cross sectional views) illustrating an alternative embodiment that provides a method of forming an integrated circuit structure with selective floating and non-floating substrates.

FIGS. 6A-6E illustrate an additional embodiment that provides a method of forming an integrated circuit structure with selective floating and non-floating substrates. As shown in FIG. 6A, this methodology begins with forming an insulator 62 on a first substrate 60 structure and bonding a second substrate 64 structure to the insulator 62 to form a laminated structure 65, using any of the methodologies and materials discussed above. As discussed above, the first substrate 60 can have a first crystalline orientation and the second substrate 64 can have a second crystalline orientation and can comprise any of the substrates discussed above. The invention can form a protective cap 66 (e.g., nitride etch stop layer, etc.) over the second substrate 64, either before or after the bonding process.

Figure 6B:
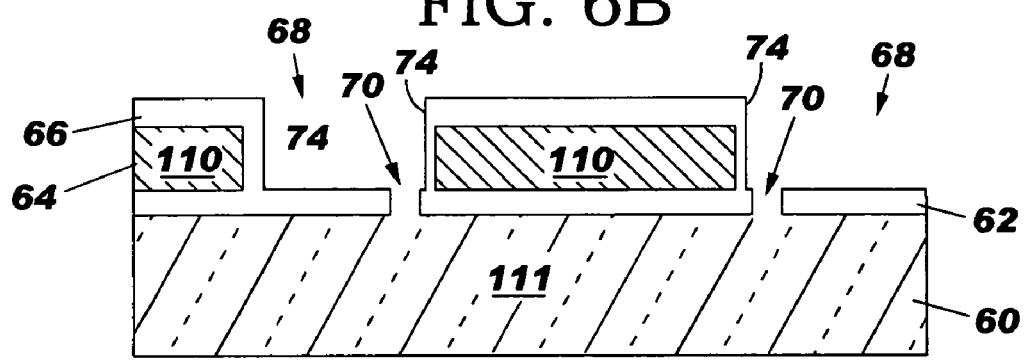

Next, as shown in FIG. 6B, the invention forms first openings 68 in the laminated structure 65 down to the insulator 62 and forms second openings 70 in the insulator 62 through the first openings 68. The first openings 68 are formed through the protective cap 66 and through the second substrate 64. The second openings 70 are smaller than the first openings 68. After forming the first openings 68, the invention forms an isolation material (e.g., oxide, etc.) 74 along sidewalls of the second substrate 64 exposed by the first openings 68.

Figure 6C:
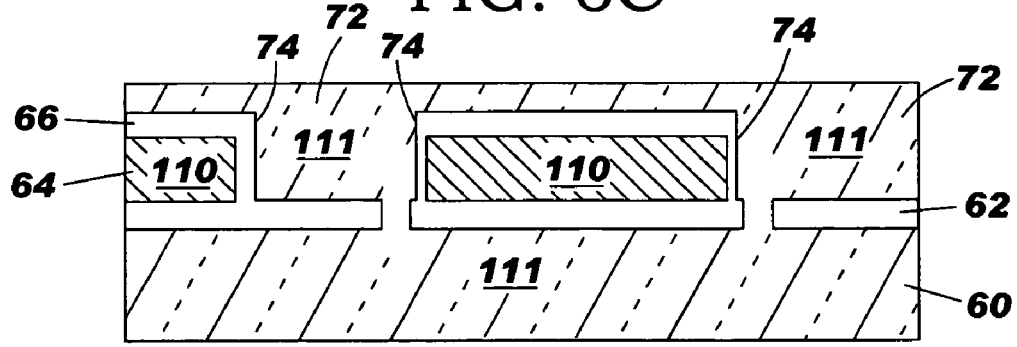
Figure 6D:
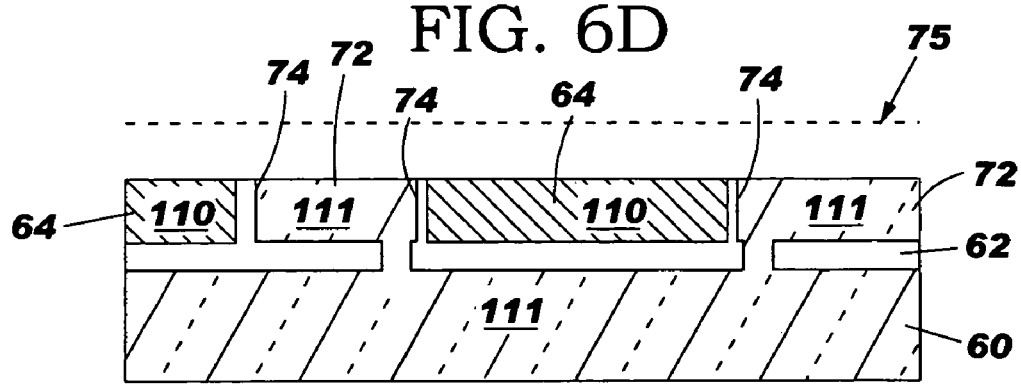

As shown in FIG. 6C, the invention epitaxialy grows additional material 72 (using the first substrate 60 as seed material) through the second openings 70 to fill at least the first openings 68. The additional material 72 that is grown through the first 68 and second openings 70 has the same crystalline orientation as the first substrate 60 because it is grown (e.g., epitaxial silicon growth) from the first substrate 60 (as seed material). The structure is planarized in FIG. 6D to produce a substrate surface 75 at the top of the laminated structure 65 that has first portions 72 having the first type of crystalline orientation and second portions 64 having the second type of crystalline orientation.

Figure 6E:
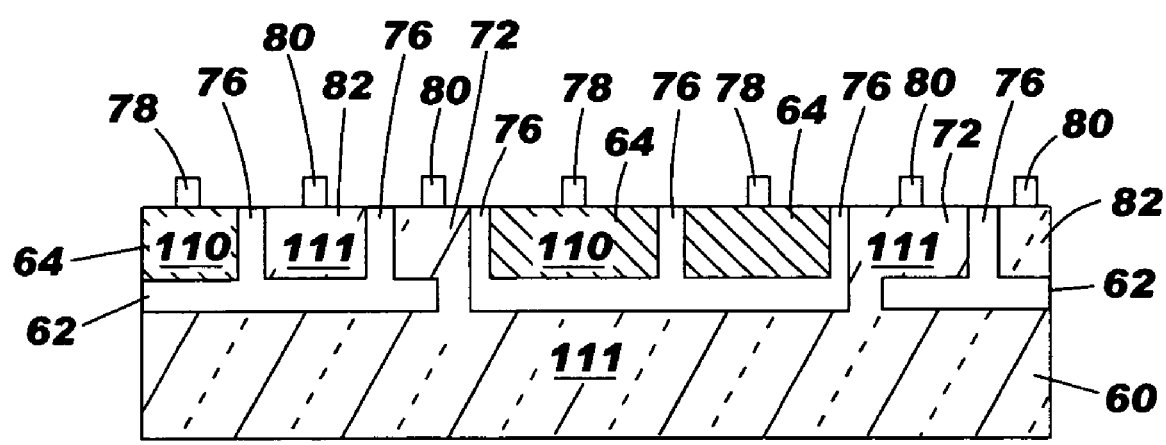

Next, as shown in FIG. 6E, the invention forms shallow trench isolation (STI) structures 76 in the first portions 72 and the second portions 64 (e.g., using well-known patterning and insulator deposition/growth processes) to subdivide the first portions 72 and the second portions 64. The second openings 70 are smaller then the distance between the shallow trench isolation structures 76 such that each of the second openings 70 is between two adjacent shallow trench isolation structures.

Some of the first portions 72 of the substrate that are formed above the second openings 70 in the insulator 62 remain as non-floating substrate portions 72, and the remaining ones of the first portions 72 become floating portions 82 (being isolated from the underlying substrate 60 by operation of the insulating STI structures 76). All of the second portions 64 of the substrate remain as floating substrate portions.

Thus, these SOI structures 76 create "floating" structures 82 that comprise silicon over insulator (SOI) structures that are electrically isolated (floating above) the underlying substrate 60 and leave some "non-floating" structures 72 that comprise biased or bulk substrate structures that are not isolated from (floating above) the underlying substrate 60. Therefore, the non-floating substrate portions 72 are biased by the substrate 60 (and layers below the substrate 60). The insulator 62 below the floating substrate portions 64, 82 electrically isolates these regions from the substrate 60. The shallow trench isolation (STI) regions exist between the non-floating substrate portions 72 and the floating substrate portions 64, 82.

The invention forms first-type transistors 80 (e.g., NFETs) above the first portions 72 of the substrate and forms second-type transistors 78 (PFETs) above the second portions 64 of the substrate. Thus, this integrated circuit structure has a substrate surface 75 having at least two types of crystalline orientations. First-type transistors (e.g., NFETs (or vice versa)) 80 are formed on first portions 72, 82 of the substrate (having the first type of crystalline orientation, e.g., 111) and second-type transistors (e.g., PFETs (or vice versa)) 78 are formed on second portions 64 of the substrate that have the second type of crystalline orientation (e.g., 110, 100, etc.). These transistors can comprise horizontal complementary metal oxide semiconductor (CMOS) transistors or fin-type field effect transistors (FinFETs).

Figure 7:
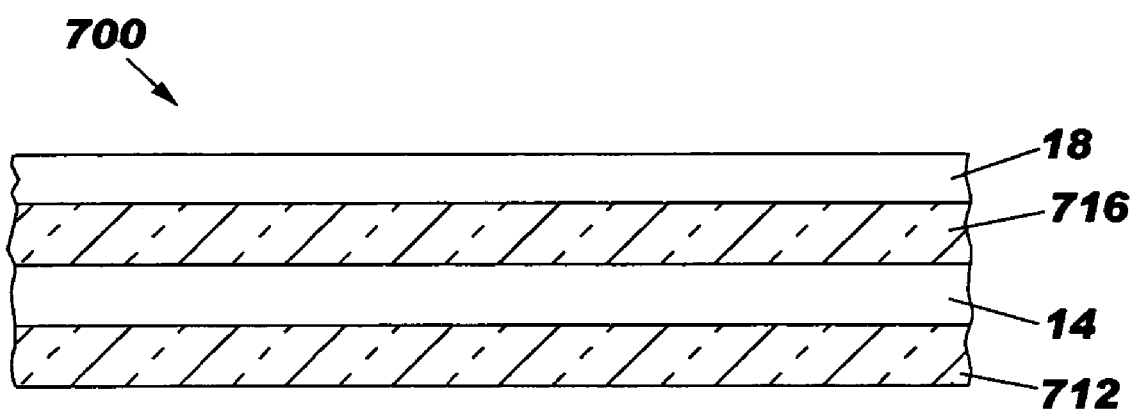
FIG. 7 is a pictorial representation (through cross sectional view) illustrating an alternative embodiment that uses substrates rotated with respect to one another.

When forming structures with FinFET transistors, rather than using materials having different crystal orientation, one substrate can be rotated 45° with respect to the other substrate during the bonding process, to provide a different crystal orientation, using the same material substrates. For example as shown in FIG. 7, rather than starting with the structures shown in FIGS. 2A, 3A, 4A, 5A and 6A, that utilize different substrates having different types of crystalline orientations, when forming FinFETs the invention can utilize a structure 700 that has identical material substrates 712, 716 that have the same type of crystalline orientations (e.g., both 110 or both 111, etc.) but where the crystalline structure of one of the substrates 712 is angled (rotated 45°) to the crystalline structure of the other substrate 716. This structure can then be applied to the exact same processing techniques shown an FIG. 2A-6E whenever FinFETs will be formed above the substrates. One advantages of this aspect of the invention is that all the fins can be formed parallel to one another while still allowing the fins to have differently directed crystalline orientations.

One unique aspect of this embodiment of the invention when compared to the previously described embodiments is that, because of the smaller second openings, there is actually an incomplete insulator below the non-floating substrate portions 72. Another unique aspect of this embodiment is that some of the first portions 72 of the substrate comprise non-floating substrate portions, and the remaining ones of the first portions 72 (and all of the second portions 64) of the substrate comprise floating substrate portions. Therefore, the invention allows the designer to select which transistors will be SOI transistors and which will be bulk transistors within one type of crystal orientation substrate group.

Figure 8A:
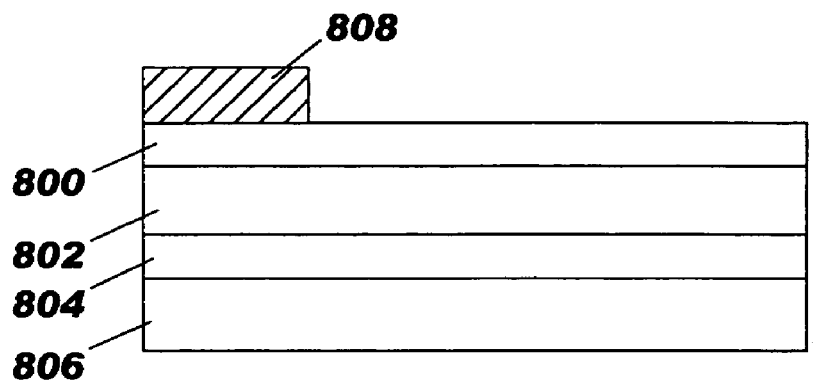
FIGS. 8A-8H are pictorial representations (through cross sectional views) illustrating an alternative embodiment that provides a method of forming FINFETs.

Another method of forming an integrated circuit structure is shown in FIGS. 8A-8H. This embodiment is directed toward forming FinFETs type transistors with different types of crystalline orientations. As shown in FIG. 8A, this embodiment begins by forming a first insulator 804 on a first substrate structure 800 with a first crystalline orientation. Next, the invention bonds a second substrate structure 806 having a second crystalline orientation to the first insulator 804 to form the laminated structure shown in FIG. 8A. An additional insulator 802 can be formed any time during this process.

The first substrate structure 802 and the second substrate structure 806 can have the same type of crystalline orientation, but the crystalline structure of the first substrate structure 802 is rotated (e.g., 45 degrees) with respect to the crystalline structure of the second substrate structure 806. Alternatively, the first substrate structure 802 and the second substrate structure 806 can be formed to have different types of crystalline orientations.

Figure 8B:
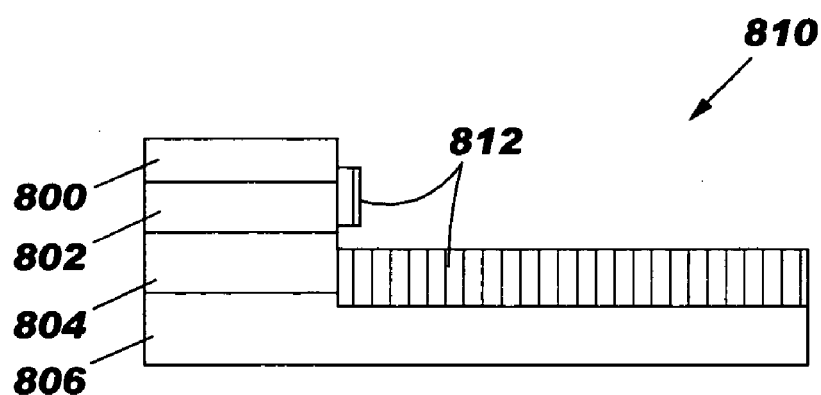

Next, the invention patterns a mask 808 over the laminated structure and forms openings 810 in the first substrate structure 802 and the insulator 804 to expose portions of the second substrate structure 806 (see FIG. 8B). Following this, the invention protects the exposed sidewall portions of the first substrate structure 802 within the openings 810 using an insulator 812. Using a directional etching process, the horizontal portions of the insulator 812 are removed, allowing only the vertical portions of the insulator 812 to remain in place to protect the sidewall portions of the first sidewall portions substrate structure 802 during the subsequent processing.

Figure 8C:
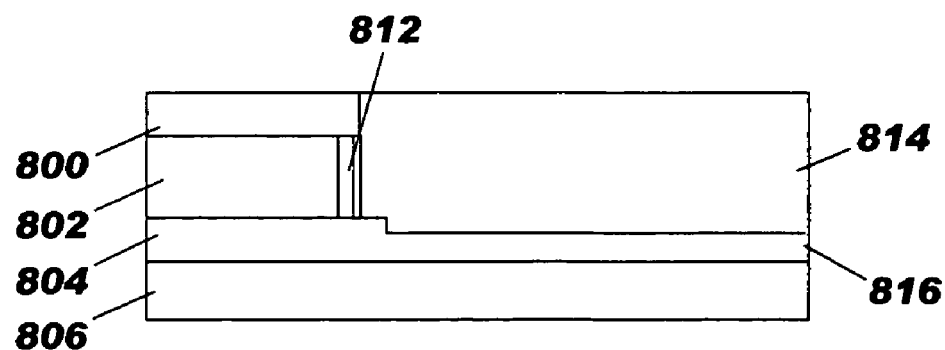

As shown in FIG. 8C, the invention then forms a silicon germanium layer 816 directly on the exposed portions of the second substrate structure 806. Then, the invention grows (e.g., epitaxially) silicon material 814 on the silicon germanium layer 816 through the openings 810 to fill the openings 810 to produce the structure shown in FIG. 8C. The silicon material 814 will have the same crystalline orientation as the material 806 from which it is grown. If the germanium concentration is low enough (e.g., 10-15% Ge) and the thickness is kept thin (eg. <1 um) the lattice structure is maintained and put in a strained condition. Higher concentrations of Ge or greater thickness will result in lattice defects.

Figure 8D:
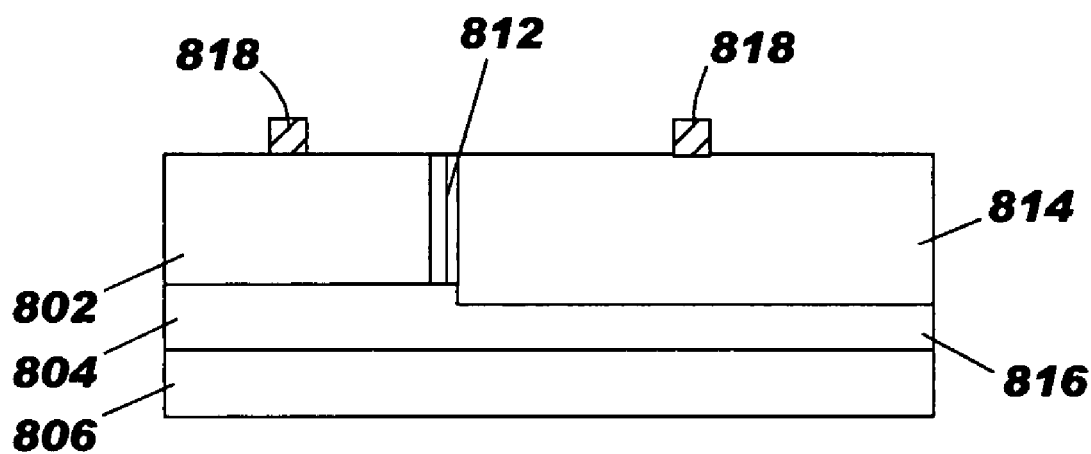

In FIG. 8D, the laminated structure is planarized to remove the insulator 800 and provide a level surface. More specifically, after planarization the surface at the top of the laminated structure has first portions 802 having the first crystalline orientation and second portions 814 having the second crystalline orientation.

Figure 8E:
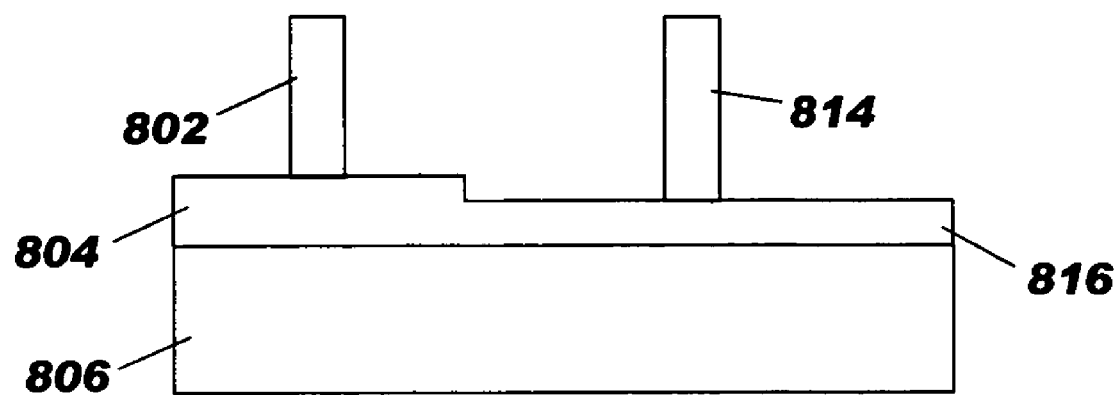

A mask 818 is formed over the structure shown in FIG. 8D and the first portions 802 and second portions 814 are patterned into first-type fins 802 and second-type fins 814 as shown in FIG. 8E. The first-type fins 802 have the first crystalline orientation and are insulated from the second substrate 806 by the insulator 804, and the second-type fins 814 have the second crystalline orientation and are positioned over the silicon germanium layer 816.

Figure 8F:
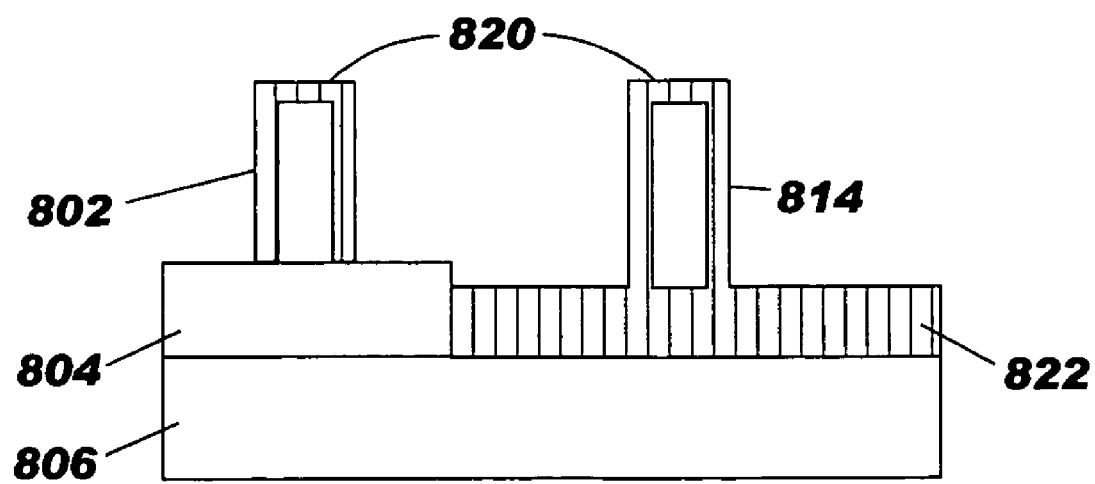

In order to insulate the second-type fins 814 from the second substrate 806, the invention changes the silicon germanium layer to an insulator. This can be done by simply oxidizing the silicon germanium layer 816 into an oxide layer 822, as shown in FIG. 8F. The SiGe layer may be thick and will not necessarily be entirely oxidized. The main idea is that the SiGe under the FIN be oxidized to separate the FIN from the substrate. Some SiGe on the underlying silicon may remain unoxidized.

Figure 8G:
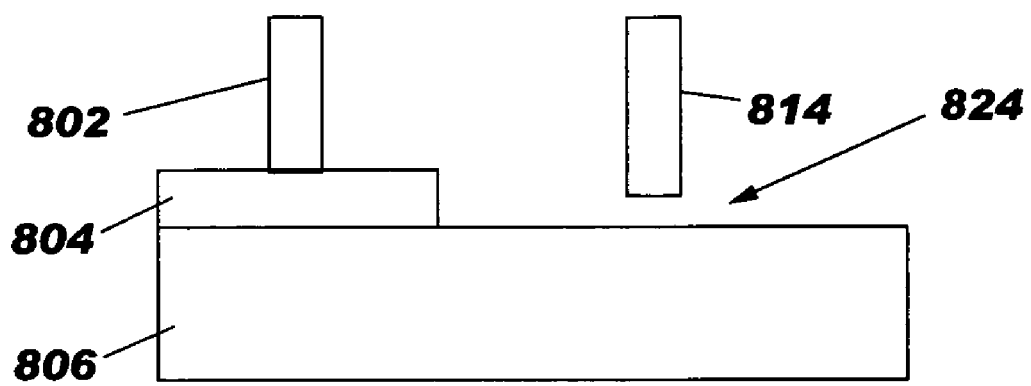
Figure 8H:
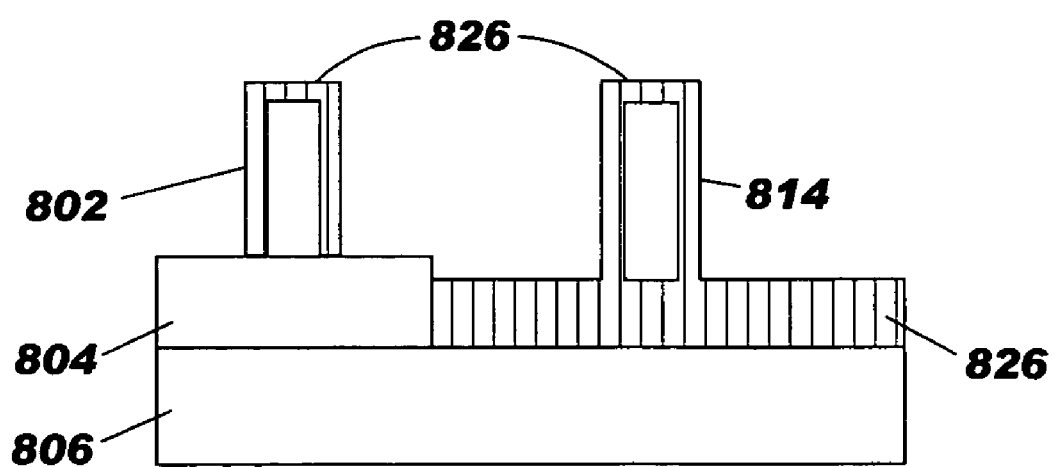

The silicon germanium layer 816 will oxidize at a substantially faster rate than the silicon fins 802, 814. Therefore, this oxidation process that oxidizes the silicon germanium layer 816 will not completely oxidize the fins 802, 814, but instead will create an oxide 820 on the exterior of the fins 802, 814. If desired, this oxide 820 can be used as the gate oxide of the FinFET transistors. Alternatively, as shown in FIGS. 8G and 8H, the silicon germanium layer 816 can be removed and replaced with an oxide. More specifically, as shown in FIG. 8G, a selective etching process can be utilized to remove the silicon germanium layer 816 without substantially affecting the silicon fins 802, 814. This leaves a gap 824 below the second-type fins 814. Note that this process does not remove the second-type fins 814 because the second-type fins 814 are connected to the three-dimensional sidewalls of the openings (which are not shown in the cross-sectional schematic diagrams of FIGS. 8A-8H). Subsequently, as shown in FIG. 8H, the invention grows an oxide 826 over the exposed silicon, which provides an insulator between the second-type fins 814 and the second-type substrate 806. Once again, this insulator 826 can be used as the gate oxide in subsequent processing.

The ends of the fins are then doped to create source and drain regions and gate conductors are formed over the central portions of the fins. Various insulators are formed over the structures and contacts are made to the source, drain, gate conductors, etc. as is well known to those ordinarily skilled in the FinFET technology art. Therefore, this process simultaneously produces FinFET type transistors that have fins of different crystalline orientation and further provides that the fins are insulated from the underlying substrate.

While the invention has been described in terms of preferred embodiments, those skilled in the art will recognize that the invention can be practiced with modification within the spirit and scope of the appended claims.

What is claimed is:

1. A method of forming an integrated circuit structure, said method comprising:
   forming an insulator on a first substrate structure;
   bonding a second substrate structure to said insulator to form a laminated structure having a first substrate with a first crystalline orientation below said insulator, and a second substrate with a second crystalline orientation above said insulator;
   forming first openings in said second substrate down to said insulator;
   forming second openings in said insulator through said first openings to expose said first substrate, wherein said second openings are smaller than said first openings;
   growing material on said first substrate through said second openings to fill said first openings to produce a surface at the top of said laminated structure that has first portions having said first type of crystalline orientation and second portions having said second type of crystalline orientation;
   forming first-type transistors above said first portions of said surface; and
   forming second-type transistors above said second portions of said surface,
   wherein ones of said first portions of said surface that are formed above said second openings in said insulator comprise non-floating substrate portions, and
   wherein remaining ones of said first portions and all of said second portions of said surface comprise floating substrate portions.

2. The method in claim 1, wherein said material has the same crystalline orientation as said first substrate.

3. The method in claim 1, further comprising, before said forming of said first openings, forming a protective cap over said second substrate, wherein said first openings are formed through said protective cap and through said second substrate.

4. The method in claim 1, further comprising, after forming said first openings, forming an isolation material along sidewalls of said second substrate exposed by said first openings.

5. The method in claim 1, further comprising, after said process of growing said material, forming shallow trench isolation (STI) structures in said first portions and said second portions to subdivide said first portions and said second portions.

6. The method in claim 1, wherein said second openings are smaller then the distance between said shallow trench isolation structures such that each of said second openings is between two adjacent shallow trench isolation structures.

7. A method of forming an integrated circuit structure, said method comprising:
   forming an insulator on a first substrate structure;
   bonding a second substrate structure to said insulator to form a laminated structure having said insulator between said first substrate structure and said second substrate structure, wherein said first substrate structure and said second substrate structure have the same type of crystalline orientation, and wherein the crystalline structure of said first substrate structure is rotated with respect to the crystalline structure of said second substrate structure;
   forming openings in said first substrate structure down to said second substrate structure;
   growing material on said second substrate structure through said openings to fill said openings to produce a surface at the top of said laminated structure that has first portions and second portions, wherein the crystalline structure of said first portions is rotated with respect to the crystalline structure of said second portions;
   forming first-type fin-type field effect transistors (FinFETs) above said first portions of said surface; and
   forming second-type FinFETs above said second portions of said surface.

8. The method in claim 7, further comprising, after forming said openings, forming an isolation material along sidewalls of said openings.

9. The method in claim 7, further comprising, after said process of growing said additional material, forming shallow trench isolation (STI) structures in said first portions and said second portions to subdivide said first portions and said second portions.

10. A method of forming an integrated circuit structure, said method comprising:
    forming an insulator on a first substrate structure;
    bonding a second substrate structure to said insulator to form a laminated structure having said insulator between said first substrate structure and said second substrate structure, wherein said first substrate structure and said second substrate structure have the same type of crystalline orientation, and wherein the crystalline structure of said first substrate structure is rotated with respect to the crystalline structure of said second substrate structure;

forming first openings in said second substrate structure down to said insulator;

forming second openings in said insulator through said first openings to expose said first substrate structure, wherein said second openings are smaller than said first openings;

growing material on said first substrate structure through said second openings to fill said first openings to produce a surface at the top of said laminated structure that has first portions and second portions, wherein the crystalline structure of said first portions is rotated with respect to the crystalline structure of said second portions;

forming first-type fin-type field effect transistors (FinFETs) above said first portions of said surface; and forming second-type FinFETs above said second portions of said surface, wherein ones of said first portions of said surface that are formed above said second openings in said insulator comprise non-floating substrate portions, and wherein remaining ones of said first portions and all of said second portions of said surface comprise floating substrate portions.

11. The method in claim 10, further comprising, before said forming of said first openings, forming a protective cap over said second substrate structure, wherein said first openings are formed through said protective cap and through said second substrate.

12. The method in claim 10, further comprising, after forming said first openings, forming an isolation material along sidewalls of said second substrate exposed by said first openings.

13. The method in claim 10, further comprising, after said process of growing said material, forming shallow trench isolation (STI) structures in said first portions and said second portions to subdivide said first portions and said second portions.

14. The method in claim 10, wherein said first substrate is rotated 45° with respect to said second substrate.

15. A method of forming an integrated circuit structure, said method comprising:

forming an insulator on a first substrate structure with a first crystalline orientation;

bonding a second substrate structure having a second crystalline orientation to said insulator to form a laminated structure;

forming openings in said first substrate structure and said insulator to expose portions of said second substrate structure;

forming a silicon germanium layer on exposed portions of said second substrate structure;

growing material on said silicon germanium layer through said openings to fill said openings to produce a surface at the top of said laminated structure that has first portions having said first crystalline orientation and second portions having said second crystalline orientation;

patterning said first portions and said second portions into first-type fins and second-type fins, wherein said first-type fins have said first crystalline orientation and are insulated from said second substrate by said insulator, and wherein said second-type fins have said second crystalline orientation and are positioned over said silicon germanium layer; and changing said silicon germanium layer to an insulator layer.

16. The method in claim 15, further comprising, before forming said silicon germanium layer, protecting exposed sidewalls portion of said first substrate within said openings using an additional insulator.

17. The method in claim 15, wherein said process of changing said silicon germanium layer to an insulator layer comprises oxidizing entire thickness of said silicon germanium layer.

18. The method in claim 15, wherein said process of changing said silicon germanium layer to an insulator layer comprises:

selectively removing said silicon germanium with respect to said first-type fins and said second-type fins; and forming said insulator layer on said second substrate structure.

19. The method in claim 15, wherein said first substrate structure and said second substrate structure have the same type of crystalline orientation, and wherein the crystalline structure of said first substrate structure is rotated with respect to the crystalline structure of said second substrate structure.

20. The method in claim 15, wherein said first substrate structure and said second substrate structure have different types of crystalline orientations.

* * * * *